US006510060B2

(12) United States Patent
Jakob et al.

(10) Patent No.: US 6,510,060 B2
(45) Date of Patent: Jan. 21, 2003

(54) ELECTRICAL SUBASSEMBLY HAVING A HOLDING DEVICE AND AN ELECTRICAL COMPONENT FASTENED THERETO

(75) Inventors: Gert Jakob, Stuttgart (DE); Gerd Bohmwetsch, Marbach (DE); Bernd Eckert, Vaihingen/enz (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/045,181

(22) Filed: Oct. 18, 2001

(65) Prior Publication Data

US 2002/0153153 A1 Oct. 24, 2002

(30) Foreign Application Priority Data

Oct. 18, 2000 (DE) ........................................ 100 51 560

(51) Int. Cl.[7] .................................................. H05K 7/02
(52) U.S. Cl. ........................ 361/807; 361/811; 361/809
(58) Field of Search ................................ 361/807, 809, 361/810, 811, 822, 825; 174/52.1

(56) References Cited

U.S. PATENT DOCUMENTS 6,144,562 A * 11/2000 Voelzke et al. ............ 174/52.1
6,262,367 B1 * 7/2001 Correa ...................... 174/52.1
6,275,158 B1 * 8/2001 Toth et al. .................... 29/829

FOREIGN PATENT DOCUMENTS

DE 198 14 156 11/1999

* cited by examiner

*Primary Examiner*—Anthony Dinkins
(74) *Attorney, Agent, or Firm*—Kenyon & Kenyon

(57) ABSTRACT

An electrical subassembly includes a holding device having at least one support surface for communicating with a carrier substrate. The device is mechanically fixable to the carrier substrate. An electrical component fixed to the holding device, the component having at least one connecting element, the connecting element having at least one bent-off section positioned at the support surface of the holding device, the at least one bent-off section being electrically connected to at least one trace on the carrier substrate.

33 Claims, 4 Drawing Sheets

1 22 21 2 33 3a 32 3b 4b 41 50 51 31 35 23 36 31 34 42 4a 46

1
2
21
22
23
3a
3b
31
31
32
33
34
35
36
4a
4b
41
42
46
50
51

3a
33
39
34
50
38
39
36
38
32
31
35 b
43
4b
35
3a
h
31
64
44
37
63
62
60

43
3a
35
64
63
44
31

70
61
60
37
37
31
3b
43
3a
71

ELECTRICAL SUBASSEMBLY HAVING A HOLDING DEVICE AND AN ELECTRICAL COMPONENT FASTENED THERETO

FIELD OF THE INVENTION

The present invention relates to an electrical subassembly having a holding device and an electrical component fastened thereto.

BACKGROUND INFORMATION

It is conventional to mount relatively heavy electrical subassemblies, such as large capacitor subassemblies, on a carrier substrate, such as a printed circuit board, using a holding device. The subassembly including holding device and electrical component can then be mounted on the printed circuit board in a simple way, using, for instance, the SMD technique (surface mounted device). Such a subassembly is described, for example, in German Published Patent Application No. 198 14 156, which shows an electrical subassembly having a frame-like holding device with a central opening into which an electrical component has been set. The electrical component is a capacitor in this case, whose contact elements are connected to conducting contact surfaces of the holding frame. The contact surfaces, in turn, are conductively connected, each to one contact on the underside of the holding frame, via conductive sections of the holding frame. When the subassembly is mounted on the printed circuit board, the contacts of the subassembly are soldered to the associated printed circuit trace on the printed circuit board using the SMD technique, so that the electrical component is electrically connected to the printed circuit traces of the printed circuit board. This mounting method has the disadvantage in that the components must first be soldered to the holding frame, and then, a subsequent renewed soldering procedure is required for soldering the contacts of the holding frame to the printed circuit traces. It is also a disadvantage that the soldered joints between the contacts of the subassembly and the printed circuit traces of the printed circuit board are used at the same time for the mechanical fastening of the subassembly. In this case, vibration and shaking loads, such as occur in a motor vehicle, are directly transmitted to the soldered joints. Thus, the possibility of damage to the soldered joints and impairment of the electrical connection between the component and the printed circuit board cannot be excluded.

SUMMARY OF THE INVENTION

In the case of the electrical subassembly according to the present invention, the disadvantages of conventional arrangements are avoided. Since the contact is formed by a bent-off section of the at least one contact element of the electrical component arranged on the support surface, the mechanical fastening may be separated from the electrical connection of the component to the printed circuit board. Since the holding device used for mechanical fastening has no electrically conductive device, the shaking loads and the vibrational loads transmitted to the holding device may be kept away from the electrical junctions. Furthermore, the subassembly may be inserted on the carrier substrate as a preassembled unit. Fixing the electrical component to the holding device may be performed out with special ease, since the component is only inserted in the holding device and subsequently the contact elements of the component at the holding device are bent over. An additional soldering procedure is thus not required. In addition, by the special position of the bent-off ends, the contact elements may be reliably contacted to the printed circuit traces of the carrier substrate when mounting the electrical subassembly on a carrier substrate.

An especially secure holding of the subassembly on the carrier substrate is achieved if the holding device may be mechanically fastened to the carrier substrate using fastening means having screw threads.

The bent-off section of the at least one contact element may be arranged parallel to the support surface of the holding device, extending at least partially in a notch in the support surface, whereby the danger of damage to the contact elements during the insertion of the subassembly onto the carrier substrate is avoided.

During the mounting of the subassembly, secure contacting of the contact elements to printed circuit traces of the carrier substrate is made possible by the fact that the bent-off section of the at least one contact element, in the unmounted state of the subassembly, has one part projecting outwardly.

The part projecting from the support surface in the unmounted state of the subassembly of the bent-off section of the at least one contact element may be lowered into the notch when it is rested on the even carrier substrate. This measure makes it possible to press the support surface of the holding device with great force onto the carrier substrate achieving a particularly firm mechanical connection without stressing the electrical bonding sites by using a fastening arrangement (e.g., a fastening arrangement having screw threads). For this purpose, the notches in the support surface of the holding device have a depth and breadth which is dimensioned larger than the diameter of the bent-off section of the contact element.

In an example embodiment of the present invention, the holding device includes two spatially separated holding parts each having a support surface, the two holding parts being fastened spatially separately to the end face ends of an elongated electrical component, such as a capacitor. Thus, for example, large cylindrical capacitors may be inserted on the carrier substrate along an axis aligned parallel to the carrier substrate.

The two holding parts may have elastically flexible clamping arrangements configured to fix the electrical component.

Each holding part may include a beaker-shaped foundation having a base plate and a sidewall extending around it. The end face ends of the electrical component may be inserted into the beaker-shaped base elements. By a suitable selection of the distance between the support surface and the beaker-shaped receptacle for the component, it is possible to arrange other subassemblies on the carrier substrate, under the electrical component.

The sidewalls of the two holding parts may be subdivided into a plurality of clamping tabs by making slit-like cutouts, which makes possible a reliable and stable fixing of the electrical component to the holding device.

Furthermore, each holding part may include a projection on the side opposite the component, which has a through hole extending parallel to the base plate and perpendicular to the support surface of the respective holding part for putting through a screw.

Since each holding part has a spigot projecting from the support surface for inserting into a hollow recess in the carrier substrate, it is possible to fix the subassembly to the carrier substrate using the spigots, and subsequently to produce a soldering connection of the contact elements to the carrier substrate and to connect the subassembly to the carrier substrate using fastening means having screw threads.

At least one holding part of the subassembly may be equipped with at least one opening used for guiding through the at least one contact element projecting from the end face end of the electrical component. After the component has been pushed into the beaker-shaped holding parts, the at least one contact element may be bent off toward the support surface after the opening, and bent off again in the plane of the support surface. These measures may be performed cost-effectively in an automated line production without additional cost.

DETAILED DESCRIPTION

Figure 1:
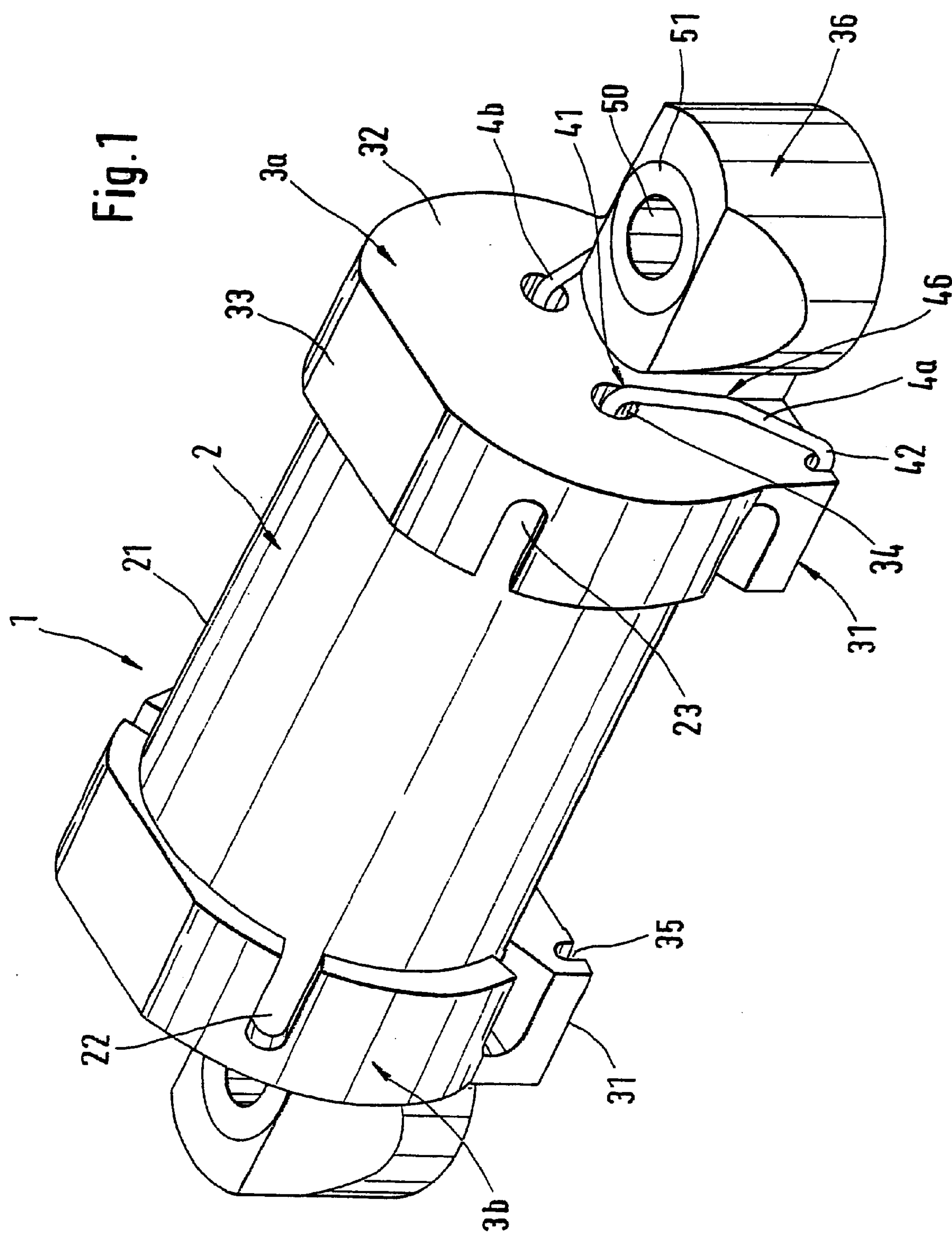
FIG. 1 is a perspective view of an electrical subassembly having a holding device and a capacitor.

FIG. 1 illustrates an example embodiment of an electrical subassembly 1, which includes holding devices 3*a* and 3*b* and an electrical component 2. Electrical component 2 includes a cylinder-shaped capacitor having an elongated foundation 21 and end face ends 22 and 23, two contact elements 4*a* and 4*b* configured as wires projecting from the one end face end 23. However, electrical component 2 may also be another electrical component, such as a transistor, a resistor or another active or passive component. Holding devices 3*a* and 3*b* are used for the mechanical fastening of component 2 on a carrier substrate, such as a printed circuit board or a ceramic carrier, contact elements 4*a* and 4*b* of the electrical component being able to be electrically connected directly to associated printed circuit traces of the carrier substrate.

Figure 2:
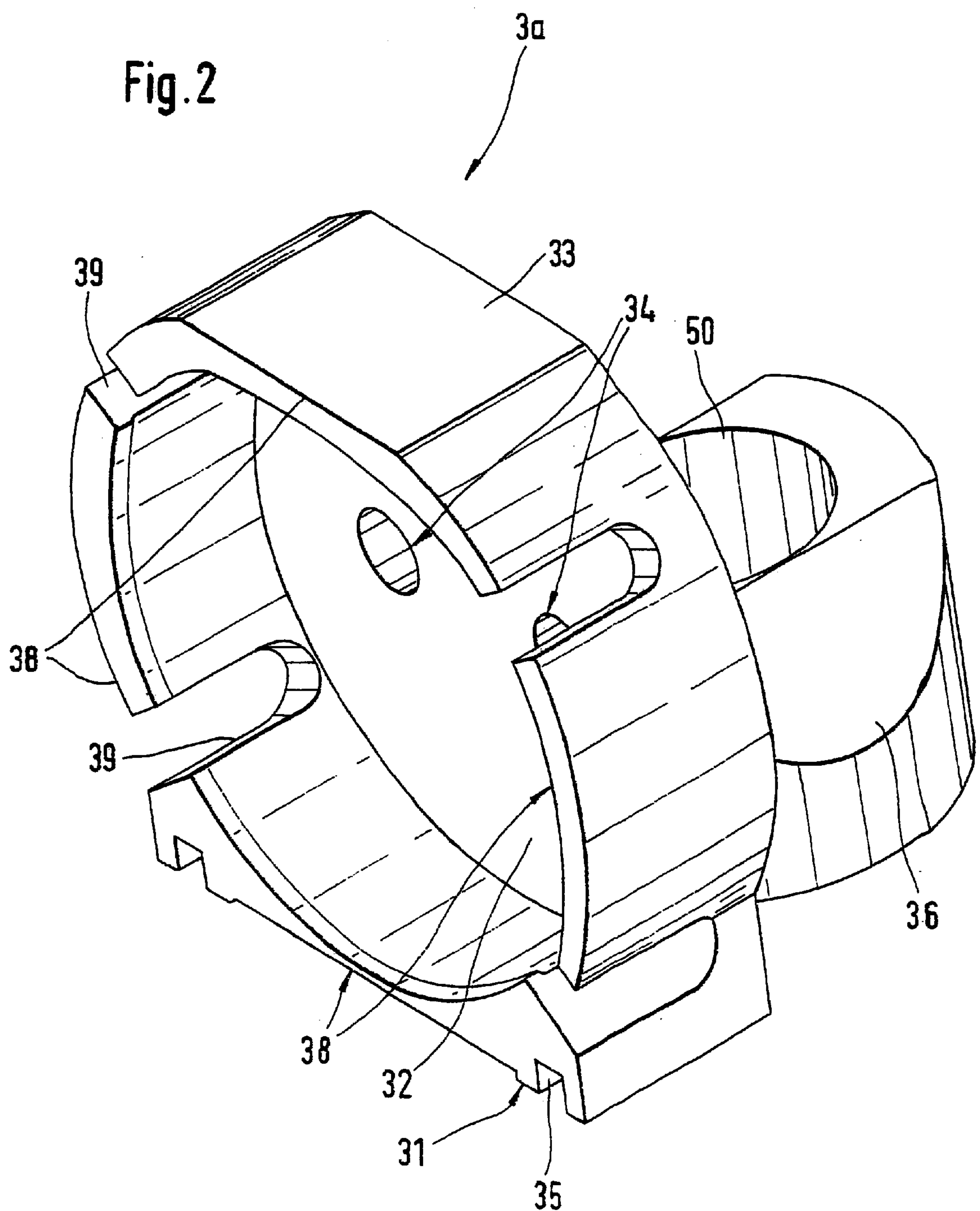
FIG. 2 is a perspective view of one holding part.

As illustrated in FIGS. 1 and 2, the holding device of this example embodiment includes two spatially separated holding parts 3*a* and 3*b* made of plastic and constructed in the same manner. However, other materials are also possible. Each of the two holding parts has a support surface 31 for placement on the carrier substrate. As illustrated in FIG. 2, a holding part includes a beaker-shaped base element having a base plate 32 and a sidewall 33 extending around it, the sidewall being subdivided into a plurality of elastically flexible clamping tabs 38 by slit-like cutouts 39. On the side of base plate 32 opposite the beaker-shaped receptacle for component 2 a projection 36 is positioned, which is equipped with a through hole 50. Through hole 50 extends parallel to base plate 32 and perpendicular to support surface 31, the support surface being formed by the flat underside of a clamping tab 38 and the underside of projection 36. Through hole 50 may be reinforced by a metal eyelet 51. Except for metal eyelet 51, the holding part is made of one piece. Base plate 32 has further through holes 34, which are used to accommodate connecting wires 4*a* and 4*b* of capacitor component 2.

Furthermore, at support surface 31 of holding part 3*a,* two groove-shaped cutouts 35 are set in. These groove-shaped cutouts are used to accommodate the end sections of the connecting wires of component 2. During the assembly of subassembly 1 the two holding parts 3*a* and 3*b* are pushed over the end face ends 22 and 23 of component 2. At that time, connecting wires 4*a* and 4*b* projecting from the end face of the component penetrate through the two through holes 34 of holding part 3*a*. Clamping tabs 38 of the two holding parts 3*a* and 3*b* grip around ends 22 and 23 of cylinder-shaped component 2 and reach the installation point along the lateral wall. As a result of the elastic clamping power of the clamping tabs, the component is reliably fixed to holding parts 3*a* and 3*b*. However, it is also possible to fix the component in the beaker-shaped holding parts by using an adhesive or another fastening arrangement. The connecting wires are subsequently bent over in the manner illustrated in FIG. 1, each connecting wire being first bent off directly after the associated through hole 34 with a first bend 41 towards support surface 31 and, at approximately the height of support surface 31 being bent off again with a second bend 42 so that its end section engages with notch 35 parallel to support surface 31. The springy tensional force of connecting wires 4*a* and 4*b* may be increased by an additional kink 46 between first bend 41 and second bend 42, which makes mounting the subassembly on a carrier substrate easier. Notch 35 and through holes 34 in second holding part 3*b* may also be omitted. However, for the sake of manufacturing simplicity, the two half parts 3*a* and 3*b* are created as identical injection-molded parts.

Figure 3A:
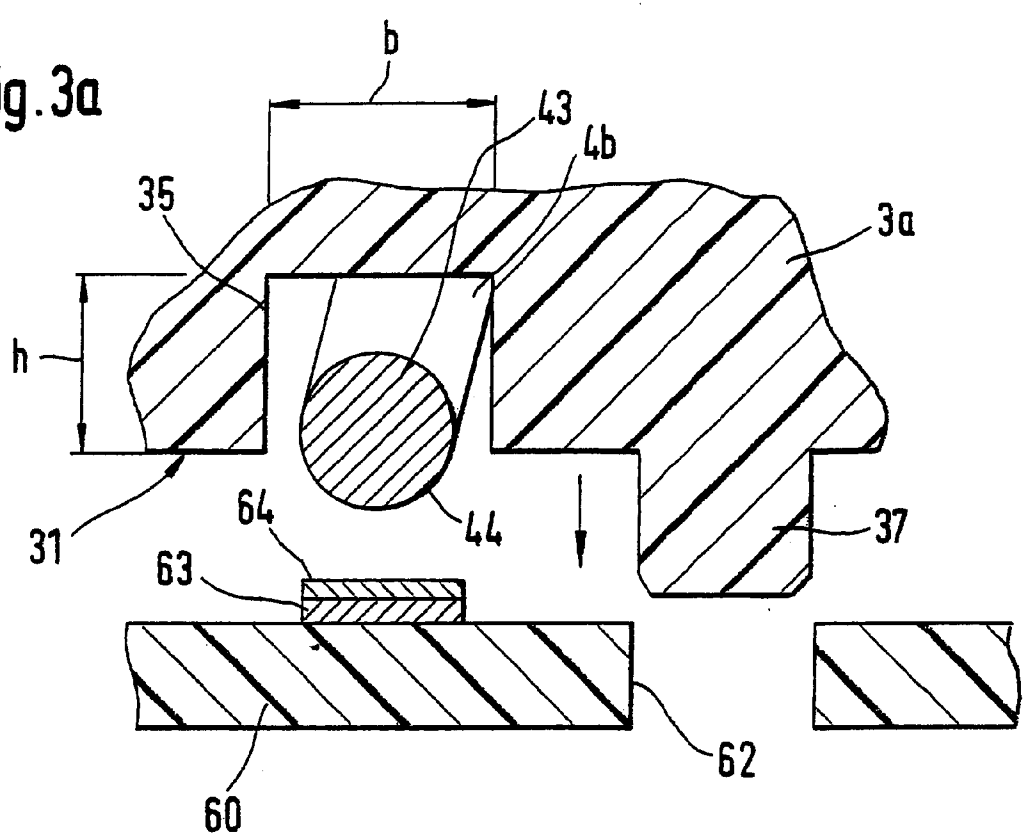
FIGS. 3*a* and 3*b* are cross-sectional views of the subassembly during insertion into a carrier substance.
Figure 3B:
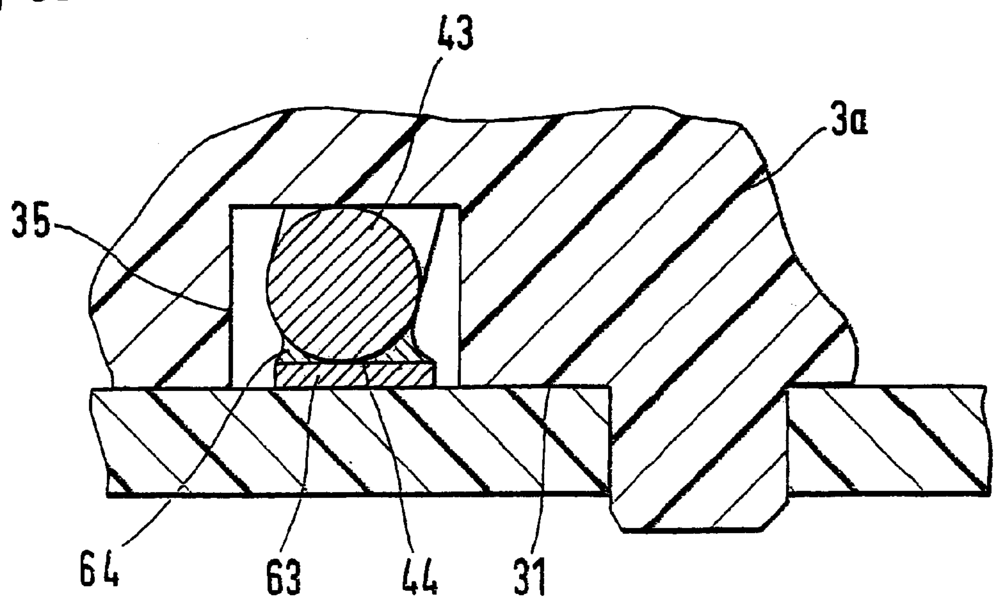

In an enlarged detailed view, FIG. 3*b* illustrates the arrangement of section 43 of connecting wire 4*b* in notch 35 of holding part 3*a*. As illustrated, notch 35 has a depth h and a width b which are each dimensioned larger than the diameter of the bent-off section 43 of connecting wire 4*b*. Section 43 has a portion 44 which projects toward the outside from supporting surface 31. Furthermore, a spigot 37 is formed at holding part 3*a* which projects perpendicularly from support surface 31.

Figure 4:
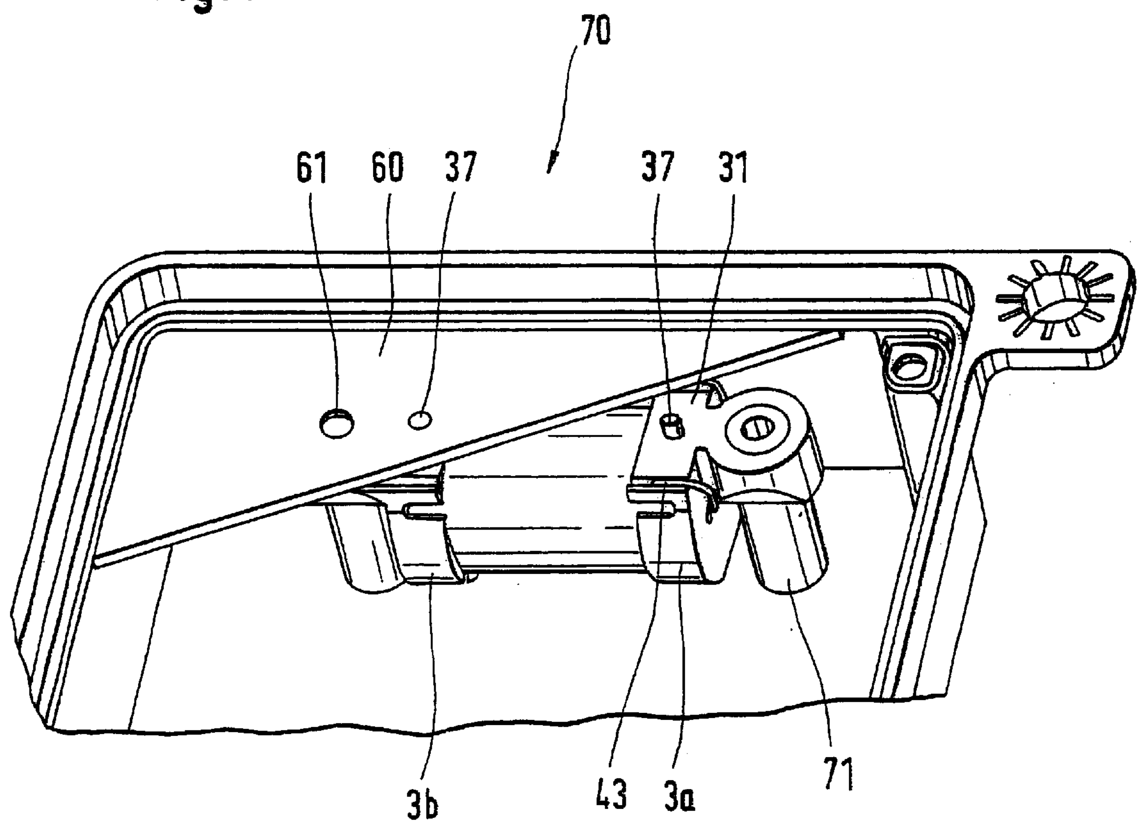
FIG. 4 is a partial perspective view of a control unit having a printed circuit board and a subassembly fixed to the printed circuit board.

Subassembly 1 is assembled on a carrier substrate 60 as follows. First, solder deposits 64 are provided on top of printed circuit traces 63. Then, subassembly 1 is positioned with holding parts 3*a* and 3*b* on carrier substrate 60, which can be done using an automatic SMD component inserting device. The level surface portions on the upper side of sidewall 33 of the holding parts are used for the up-take by the head of the component inserting device. During mounting onto the carrier substrate, spigots 37 of the two holding parts 3*a* and 3*b* enter cutouts 62 of carrier substrate 60. Section 43 of the bent off connecting wires 4*a* and 4*b* reaches the solder deposit for installation, and is then pressed into notch 35. This step is made easier if the connecting wires 4*a* and 4*b* are made elastically flexible. Kink 46 may make the spring action of connecting wires 4*a* and 4*b* even larger. In the ending position, support surface 31 reaches carrier substrate 60 for installation, as illustrated in FIG. 3*b*. Bent-off section 43, solder deposit 64, and printed circuit trace 63 penetrate into notch 35. By a reflow soldering process, sections 43 may be soldered together with printed circuit traces 63. During this procedure, holding parts 3*a* and 3*b* may be held in their position on the carrier substrate by spigots 37. Holding parts 3*a* and 3*b* may be additionally fixed to carrier substrate 60 and/or a housing part of a housing accommodating the carrier substrate by using screws, which are illustrated in FIG. 4. FIG. 4 is a sectioned illustration through a housing 70 of a control device for a motor vehicle. Subassembly 1 may be fixed to stud 71 of housing 70 and to printed circuit board 60 by screws, the screws being guided through cutouts 61 of carrier substrate 60. With the tightening of the screws, the tightening force may be transferred from support surface 31 of the holding device to carrier substrate 60 only. Thus, solder joints 64 positioned in notches 35 are not stressed. Shaking or vibrational loads acting upon control unit 70 are likewise absorbed by the stable mechanical fixing of the subassembly to the housing and are not transferred to the sensitive solder joints.

According to another example embodiment of the present invention, holding parts 3*a* and 3*b* are developed in a different manner. In particular, a one-piece holding device or a holding device made of more than two holding parts may be used. Further, the holding parts may be configured so that the electrical component is distanced from the at least one support surface by a gap. In this case, the space on the carrier substrate below component 2 may be used for other subassemblies.

In another example embodiment of the present invention, the connecting wires are connected to the printed circuit traces without soldering. In this example embodiment, the connecting elements of the electrical component are bent over at the holding device so they contact the printed circuit traces during the mounting of the subassembly onto a level carrier substrate.

What is claimed is:

1. An electrical subassembly, comprising:

a holding device mechanically fixable to a carrier substrate and including at least one support surface configured to engage the carrier substrate; and an electrical component fixed to the holding device and including at least one connecting element, the at least one connecting element being electrically conductively connected to a contact part arranged at the at least one support surface, the contact part including a bent-off section of the at least one connecting element positioned at the support surface.

2. The electrical subassembly according to claim 1, wherein the holding device is mechanically fixable to the carrier substrate with a fixing device including screw threads.

3. The electrical subassembly according to claim 1, wherein the support surface includes a notch, the bent-off section extending parallel to the support surface of the holding device and positioned at least partially in the notch.

4. The electrical subassembly according to claim 3, wherein the bent-off section includes a part that protrudes outwardly from the support surface in an unmounted state.

5. The electrical subassembly according to claim 4, wherein the protruding part of the bent-off section is configured to be lowered into the notch during installation on the carrier substrate.

6. The electrical subassembly according to claim 3, wherein a depth and a width of the notch are dimensioned larger than a diameter of the bent-off section of the connecting element.

7. The electrical subassembly according to claim 1, wherein the holding device includes two spatially separated holding parts, each holding part including a support surface; and wherein the electrical component includes an extended foundation having two end faces, each end face being fixed to a respective holding part.

8. The electrical subassembly according to claim 7, wherein the holding parts include an elastically flexible clamp device configured to fix the electrical component.

9. The electrical subassembly according to claim 7, wherein each holding part includes a beaker-shaped base body having a base plate, the clamp device including a sidewall extending around the base plate.

10. The electrical subassembly according to claim 9, wherein the sidewalls of at least one of the holding parts is subdivided by slit-shaped cutouts into a plurality of clamping tabs, the clamp device including the clamping tabs.

11. The electrical subassembly according to claim 9, wherein each holding part includes a projection on a side opposite the electrical component, the projection including a through hole configured to receive a screw, the through hole extending parallel to the base plate and perpendicular to the support surface.

12. The electrical subassembly according to claim 7, wherein each holding part includes a spigot protruding from the support surface configured to be introduced into a cutout of the carrier substrate.

13. The electrical subassembly according to claim 1, wherein at least one holding part includes at least one opening configured to receive therethrough the at least one connecting element protruding from an end face end of the electrical component.

14. The electrical subassembly according to claim 13, wherein the at least one connecting element is bent-off toward the support surface outside the opening and is bent-off in a plane of the support surface.

15. The electrical subassembly according to claim 1, wherein the holding device is made of plastic.

16. The electrical subassembly according to claim 1, wherein the electrical component includes a capacitor.

17. A carrier substrate, comprising:

an electrical subassembly, the electrical subassembly including:

a holding device mechanically fixable to the carrier substrate and including at least on support surface configured to engage the carrier substrate; and an electrical component fixed to the holding device and including at least one connecting element, the at least one connecting element being electrically conductively connected to a contact part arranged at the at least one support surface, the contact part including a bent-off section of the at least one connecting element positioned at the support surface.

18. The carrier substrate according to claim 17, wherein the holding device is mechanically fixable to the carrier substrate with a fixing device including screw threads.

19. The carrier substrate according to claim 17, wherein the support surface includes a notch, the bent-off section extending parallel to the support surface of the holding device and positioned at least partially in the notch.

20. The carrier substrate according to claim 19, wherein the bent-off section includes a part that protrudes outwardly from the support surface in an unmounted state.

21. The carrier substrate according to claim 20, wherein the protruding part of the bent-off section is configured to be lowered into the notch during installation on the carrier substrate.

22. The carrier substrate according to claim 19, wherein a depth and a width of the notch are dimensioned larger than a diameter of the bent-off section of the connecting element.

23. The carrier substrate according to claim 17, wherein the holding device includes two spatially separated holding parts, each holding part including a support surface; and wherein the electrical component includes an extended foundation having two end faces, each end face being fixed to a respective holding part.

24. The carrier substrate according to claim 23, wherein the holding parts include an elastically flexible clamp device configured to fix the electrical component.

25. The carrier substrate according to claim 24, wherein each holding part includes a beaker-shaped base body having a base plate, the clamp device including a sidewall extending around the base plate.

26. The carrier substrate according to claim 25, wherein the sidewalls of at least one of the holding parts is subdivided by slit-shaped cutouts into a plurality of clamping tabs, the clamp device including the clamping tabs.

27. The carrier substrate according to claim 25, wherein each holding part includes a projection on a side opposite the electrical component, the projection including a through hole configured to receive a screw, the through hole extending parallel to the base plate and perpendicular to the support surface.

28. The carrier substrate according to claim 23, wherein each holding part includes a spigot protruding from the support surface configured to be introduced into a cutout of the carrier substrate.

29. The carrier substrate according to claim 17, wherein at least one holding part includes at least one opening configured to receive therethrough the at least one connecting element protruding from an end face end of the electrical component.

30. The carrier substrate according to claim 29, wherein the at least one connecting element is bent-off toward the support surface outside the opening and is bent-off in a plane of the support surface.

31. The carrier substrate according to claim 17, wherein the holding device is made of plastic.

32. The carrier substrate according to claim 17, wherein the electrical component includes a capacitor.

33. The carrier substrate according to claim 17, wherein the carrier substrate includes a printed circuit board.

* * * * *